(12) United States Patent
Kwon et al.

(10) Patent No.: US 8,110,982 B2
(45) Date of Patent: Feb. 7, 2012

(54) ORGANIC LIGHT EMITTING DIODE DISPLAY DEVICE AND METHOD OF FABRICATING THE SAME

(75) Inventors: Oh-June Kwon, Suwon-si (KR);
Sun-Young Jung, Suwon-si (KR);
Ji-Hun Ryu, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 198 days.

(21) Appl. No.: 12/378,433

(22) Filed: Feb. 13, 2009

(65) Prior Publication Data
US 2010/0044730 A1    Feb. 25, 2010

(30) Foreign Application Priority Data

Feb. 14, 2008    (KR) .................. 10-2008-0013277

(51) Int. Cl.
*H01L 33/00* (2010.01)
(52) U.S. Cl. ............. 313/504; 257/40; 257/E33.001
(58) Field of Classification Search .......... 257/98, 257/E33.001; 313/503–506, 512; 428/323, 428/690, 917
See application file for complete search history.

(56) References Cited

U.S. PATENT DOCUMENTS

2005/0046344 A1 * 3/2005 Lee et al. ................ 313/504

FOREIGN PATENT DOCUMENTS

| KR | 10-2005-0010981 A | 1/2005 |
| KR | 10-2005-0082422 A | 8/2005 |
| KR | 10-0671645 B1 | 1/2007 |
| KR | 10-2007-0024134 | 3/2007 |
| KR | 10-2007-0092160 A | 9/2007 |

OTHER PUBLICATIONS

Notice of Allowance for corresponding Korean Application No. 10-2008-0013277 issued Aug. 27, 2009.

* cited by examiner

*Primary Examiner* — Cuong Q Nguyen
*Assistant Examiner* — Tran Tran
(74) *Attorney, Agent, or Firm* — Knobbe Martens Olson & Bear LLP

(57) ABSTRACT

An organic light emitting diode display device having a frit which can improve mechanical strength and adhesion between the upper substrate and the lower substrate, and a method of fabricating the same are disclosed. The organic light emitting diode display device includes a lower substrate, an organic light emitting diode disposed on the lower substrate, an upper substrate to be coupled to the lower substrate, and a frit disposed between the lower substrate and the upper substrate to couple both the lower substrate and the upper substrate to each other where the frit has a plurality of pores.

10 Claims, 5 Drawing Sheets

ORGANIC LIGHT EMITTING DIODE DISPLAY DEVICE AND METHOD OF FABRICATING THE SAME

CROSS-REFERENCE TO RELATED APPLICATIONS

This application claims the benefit of Korean Patent Application No. 2008-13277, filed Feb. 14, 2008, the disclosure of which is hereby incorporated herein by reference in its entirety.

BACKGROUND

1. Field

The field relates to an organic light emitting diode (OLED) display device and a method of fabricating the same, and more particularly, to an OLED display device and a method of fabricating the same, where the display device has improved mechanical strength because of a plurality of pores formed in a frit to absorb external impact, and has improved adhesion between the upper substrate and the lower substrate because a small height difference between the frit and an upper or lower substrate is filled.

2. Description of the Related Technology

Generally, in an OLED display device, a lower substrate having a pixel region and a non-pixel region is disposed to face an upper substrate for encapsulation, and is coupled to the upper substrate by a sealant such as epoxy.

A plurality of organic light emitting diodes are formed between a scan line and a data line in the pixel region of the lower substrate, and each of the organic light emitting diodes includes an anode electrode, a cathode electrode, and an organic layer having an organic light emitting layer formed between the anode electrode and the cathode electrode.

Since the organic light emitting diode described above includes an organic material, it is vulnerable to hydrogen and oxygen, and since the organic light emitting diode includes the cathode electrode formed of a metallic material as an upper electrode, it is easily oxidized by moisture in the air, and as a result, its electrical and emitting characteristics are degraded. For these reasons, to protect the organic light emitting diode, a powder-type desiccant is disposed on the upper substrate formed of metal, glass or plastic, or a film-type desiccant is attached to the upper substrate, thereby removing moisture permeated from outside.

However, when the powder-type desiccant is used, the process becomes complicated, and the number of materials, production costs and a thickness of the display device are increased. Particularly, the powder-type desiccant is difficult to apply to a top-emission structure. On the other hand, when the film-type desiccant is used, there is a limitation in removing moisture and durability and reliability are reduced, and thus it is difficult to use in mass-production.

To solve these problems, a frit having an excellent encapsulation characteristic due to very low permeability may be formed between the lower substrate and the upper substrate to effectively protect the organic light emitting diode without using a desiccant separately.

However, the frit has poor flexibility and malleability and thus is very vulnerable when it is deformed. Therefore, when the frit is exposed to external impact, a crack may be generated in the frit, so that the organic light emitting diode display device may be damaged or delaminate.

SUMMARY OF THE CERTAIN INVENTIVE ASPECTS

One aspect is an organic light emitting diode (OLED) display device. The device includes a lower substrate, an organic light emitting diode disposed on the lower substrate, an upper substrate coupled to the lower substrate, and a frit disposed between the lower substrate and the upper substrate coupling the lower substrate to the upper substrate, where the frit includes a plurality of pores.

Another aspect is a method of fabricating an organic light emitting diode display device. The method includes providing a lower substrate, forming an organic light emitting diode on the lower substrate, providing an upper substrate, and forming a frit between the lower substrate and the upper substrate, wherein the frit couples the lower substrate to the upper substrate, and wherein the frit comprises a plurality of pores.

BRIEF DESCRIPTION OF THE DRAWINGS

The above and other objects, features and advantages of certain embodiments will be described with reference to the attached drawings in which.

DETAILED DESCRIPTION OF CERTAIN INVENTIVE EMBODIMENTS

The present invention will now be described more fully with reference to the accompanying drawings, in which various embodiments are shown.

Figure 1:
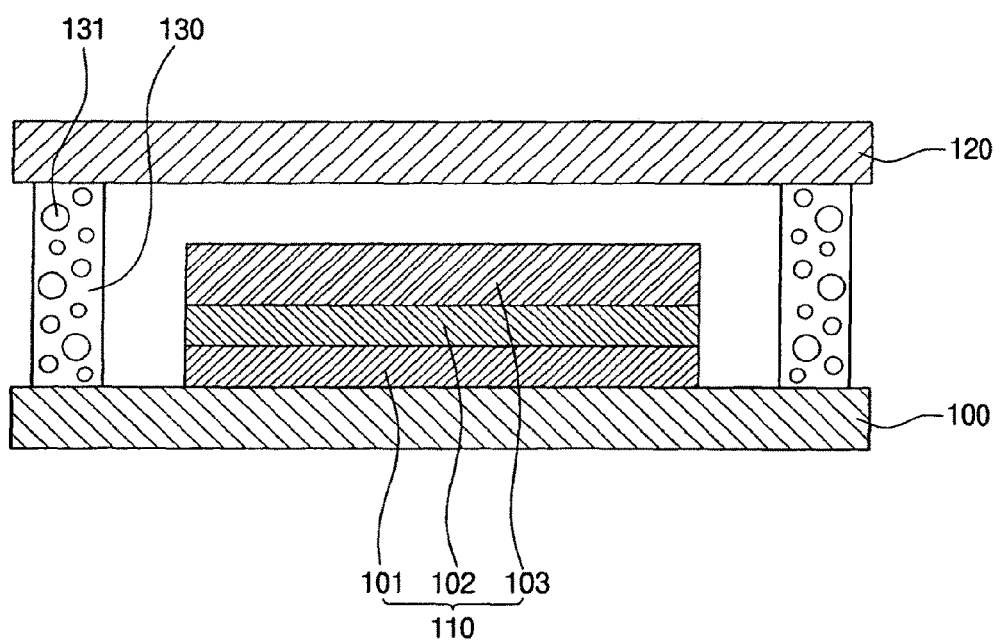
FIG. 1 is a cross-sectional view of an organic light emitting diode display device according to an embodiment.

FIG. 1 is a cross-sectional view of an organic light emitting diode (OLED) display device according to an embodiment.

Referring to FIG. 1, a lower substrate 100 is used. The lower substrate 100 may comprise a glass, plastic or conductive substrate. When the lower substrate 100 is formed of glass, it can have a more excellent adhesion characteristic to a frit.

An organic light emitting diode 110 is disposed on the lower substrate 100. The organic light emitting diode 110 includes a first electrode 101, an organic layer 102 including a light emitting layer, and a second electrode 103. The first electrode 101 may be an anode, which may be formed of indium thin oxide (ITO) or indium zinc oxide (IZO). In a top-emission structure, a reflective layer may be further formed under the ITO or IZO layer.

The organic layer 102 may include at least a light emitting layer, and may further include at least one of a hole injection layer, a hole transport layer, a hole blocking layer, an electron transport layer, an electron injection layer and an electron blocking layer.

The second electrode 103 may be a cathode, which may be formed of at least one of magnesium (Mg), silver (Ag), aluminum (Al), calcium (Ca), and an alloy thereof having a low work function.

The organic light emitting diode 110 may further include a thin film transistor including a semiconductor layer, a gate electrode, and source and drain electrodes.

The thin film transistor may be a top gate thin film transistor having a gate electrode formed on a semiconductor layer, or a bottom gate thin film transistor having a gate electrode formed under a semiconductor layer.

An upper substrate 120 is disposed on the organic light emitting diode 110. The upper substrate 120 may comprise at least one of glass, plastic, and a conductive material. When the upper substrate 120 is formed of glass, it can have a more excellent adhesion characteristic to a frit.

Between the lower substrate 100 and the upper substrate 120, a frit 130 is disposed to couple the lower substrate 100 to the upper substrate 120 and thus encapsulate the organic light emitting diode 110, which can prevent permeation of moisture from outside. The frit 130 is disposed along edges of the substrates 100 and 120.

The frit 130 according to the present invention has a plurality of pores 131. Generally, a frit has poor flexibility and malleability, and thus is susceptible to mechanical failure when it is deformed. Therefore, when exposed to external impact, the frit does not absorb the external impact well, and easily cracked. However, in this embodiment, because the frit 130 has the plurality of pores 131, the frit 130 can absorb at least some of the external impact. Accordingly, mechanical strength of the OLED display device using a porous frit is greatly improved. Moreover, a small gap may exist between the frit 130 and the lower substrate 100 or upper substrate 120 and, in some embodiments, the gap is filled as the pores 131 in the frit 130 expand, and thus adhesion between the lower substrate 100 and the upper substrate 120 may be also improved.

The pores 131 may have a size of about 0.21 μm to about 10 μm. The pores 131 may have a size of about 0.2 μm or more to effectively absorb external impact and effectively improve adhesion between the substrates 100 and 120. The pores 131 may have a size of about 10 μm or less to maintain bearing strength of the upper substrate 120 and lower substrate 100. Pores 131 of less than about 0.2 μm and/or greater than about 10 μm may also be used.

A porosity of the frit 130 may be about 5% to about 95%. The frit may have a porosity of about 5% or more to effectively absorb external impact and improve adhesion between the substrates 100 and 120, and may have a porosity of about 95% or less to maintain the bearing strength of the upper substrate 120 and the lower substrate. Due to characteristics of the material for the frit 130, moisture from outside does not permeate the frit 130, and in some embodiments, the frit 130 has a porosity of 70% or less to effectively prevent any possible permeation of moisture from the outside through the pores 131.

The frit 130 may be a glass frit formed of at least one of $MgO$, $CaO$, $BaO$, $Li_2O$, $Na_2O$, $K_2O$, $B_2O_3$, $V_2O_5$, $ZnO$, $TeO_2$, $Al_2O_3$, $SiO_2$, $PbO$, $SnO$, $P_2O_5$, $Ru_2O$, $Rh_2O$, $Fe_2O_3$, $CuO$, $TiO_2$, $WO_3$, $Bi_2O_3$, $Sb_2O_3$, lead-borate glass, tin-phosphate glass, vanadate glass and borosilicate glass.

In some embodiments, the frit 130 may further include a filler. When the frit 130 includes the filler, a pore may be more easily formed compared to the frit without a filler. Thus, the filler is preferably added to the frit 130. The filler may be at least one of a zirconium-tungsten-phosphate based filler, a zirconium-phosphate based filler (e.g., zirconium phosphate), a zirconium based filler (e.g., zirconium), an eucryptite based filler (e.g., beta-eucryptite), a cordierite based filler, alumina, silica, zinc silicate, and aluminum titanate. The filler may be added to the frit 130 at between about 3 wt % to about 30 wt %. When the filler is added in this range, pores are formed more easily.

The frit 130 may further include an absorber for absorbing laser or infrared radiation.

Figure 2A:
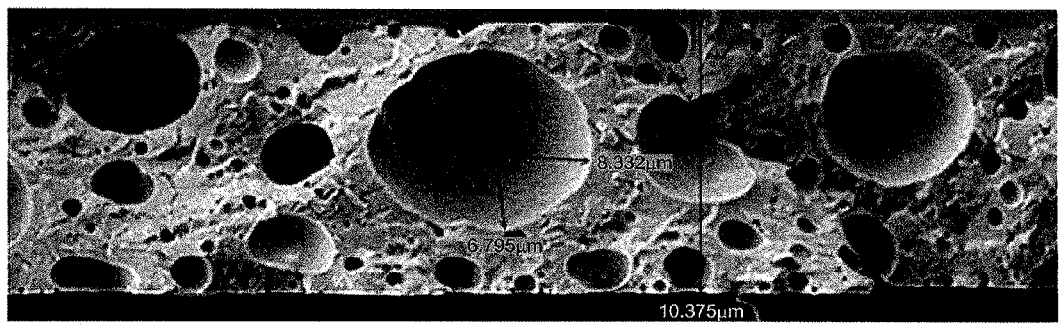
FIGS. 2A and 2B are photographs of an OLED display device including a frit with pores according to an embodiment and an OLED display device including a frit without pores, respectively, which have each been dropped from a height of 1.5 m.
Figure 2B:
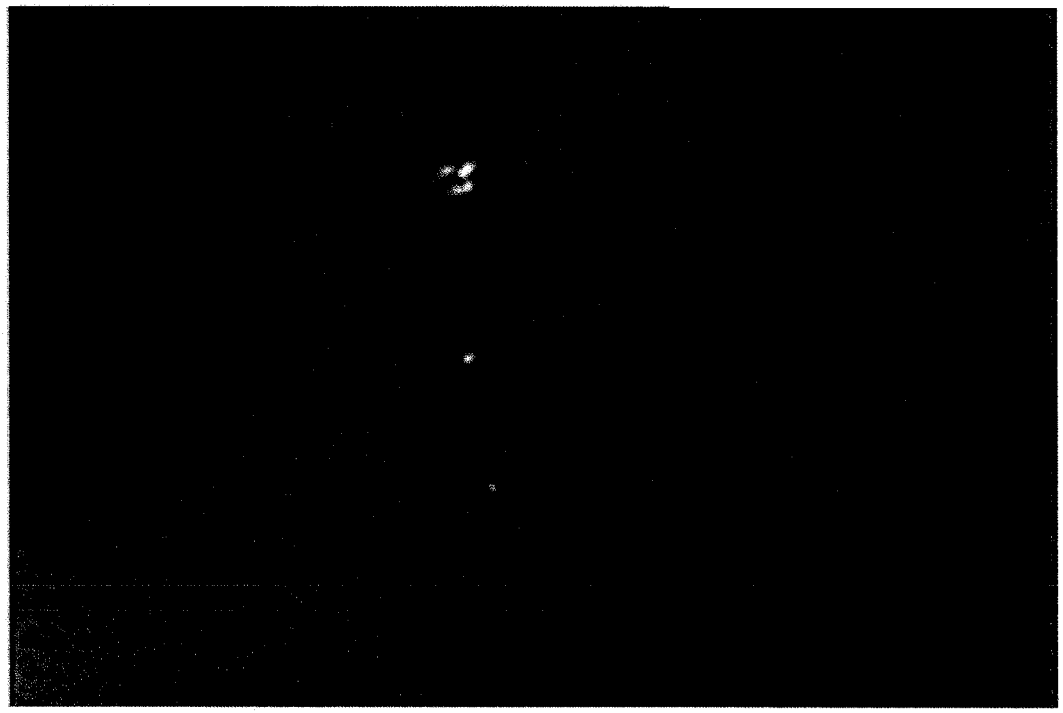

FIGS. 2A and 2B are photographs of an OLED display device including a frit with pores according to one embodiment and an OLED display device including a frit without pores, respectively, which have each been dropped from a height of 1.5 m FIG. 2A is a photograph of a section of a frit after the OLED display device including the frit with pores according to an exemplary embodiment is dropped from 1.5 m. Referring to FIG. 2A, it can be seen that pores having various sizes, 0.2 to 10 μm, are formed in the frit, and no crack is found in the frit after the drop of the OLED display device. On the other hand, FIG. 2B is a photograph of a section of a frit after the OLED display device including the frit without pores is dropped. Unlike the exemplary embodiment of the frit of FIG. 2A, it can be seen that no pores are formed in the frit and a crack is generated therein by the drop of the OLED display device. As shown in these Figures, when a plurality of pores are formed in the frit, the pores absorb external impact, so that the organic light emitting diode is effectively protected from external impact and mechanical strength of the OLED display device can be greatly improved, while effectively preventing moisture permeated from outside.

Figure 3A:
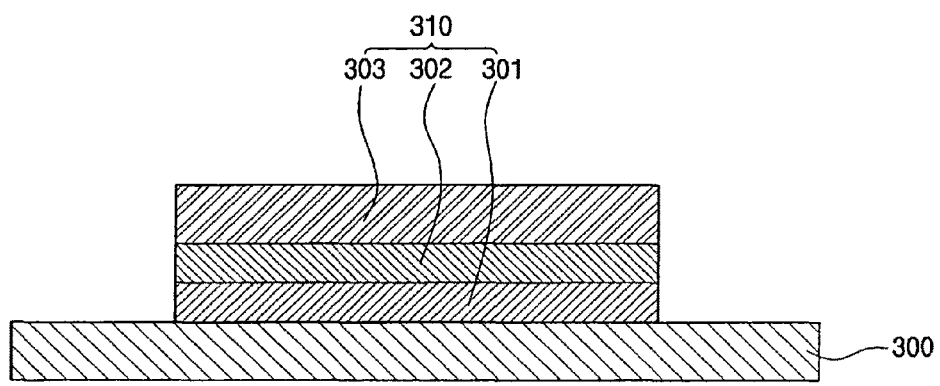
FIGS. 3A, 3B and 3D are cross-sectional views illustrating a method of fabricating an organic light emitting diode display device according to an embodiment.
Figure 3B:
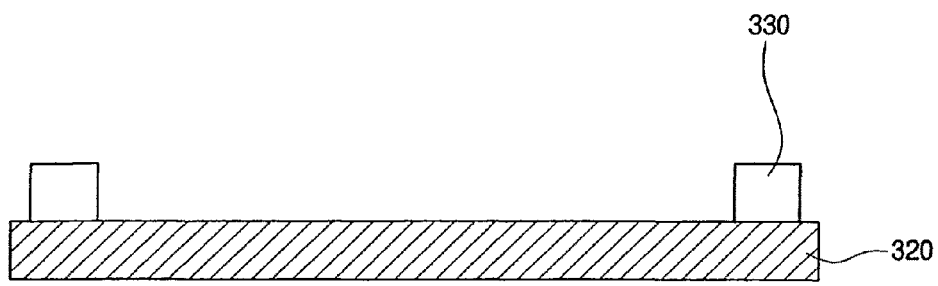
Figure 3C:
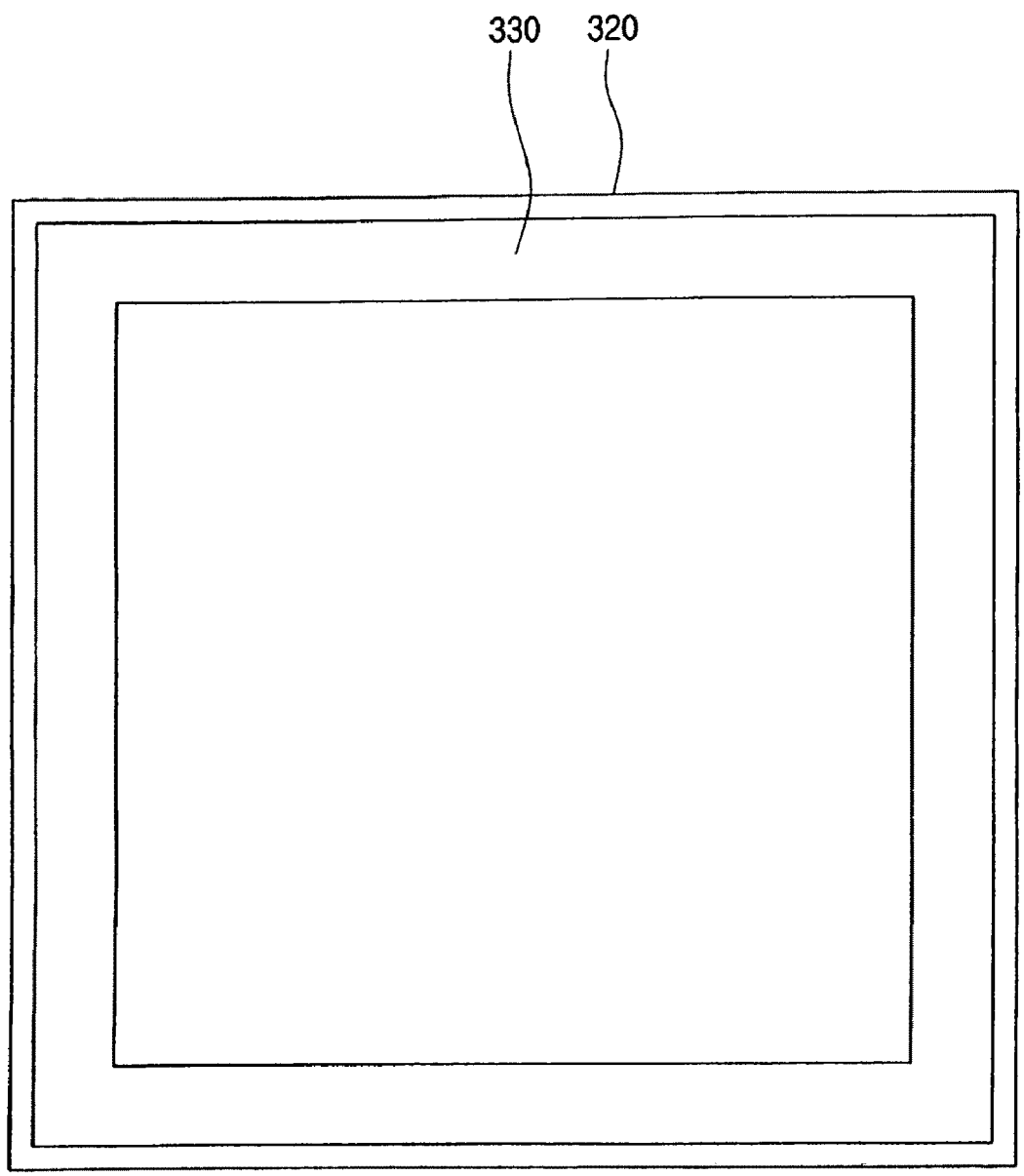
FIG. 3C is a plan view of the device shown in FIG. 3B.
Figure 3D:
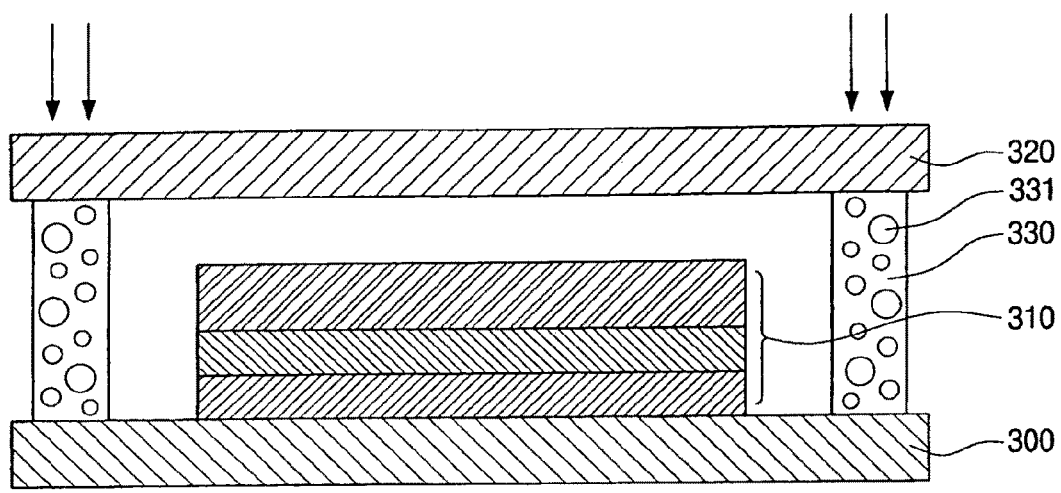

FIGS. 3A, 3B and 3D are cross-sectional views illustrating a method of fabricating an OLED display device according to an embodiment, and FIG. 3C is a plan view of FIG. 3B.

Referring to FIG. 3A, a lower substrate 300 is provided. The lower substrate 300 may comprise at least one of a glass, a plastic, and a conductive material. When the lower substrate 300 is formed of glass, the lower substrate 300 may have a more excellent adhesion characteristic to a frit.

An organic light emitting diode 310 is formed on the lower substrate 300. The organic light emitting diode 310 includes a first electrode 301, an organic layer 302 having at least a light emitting layer, and a second electrode 303.

In the organic light emitting diode 310, the first electrode 301 may be an anode, which may be formed of ITO or IZO. In a top-emission structure, a reflective layer may be further formed under the ITO or IZO layer.

The organic layer 302 includes a light emitting layer, and may further include at least one of a hole injection layer, a hole transport layer, a hole blocking layer, an electron transport layer, an electron injection layer, and an electron blocking layer.

The second electrode 303 may be a cathode, which may be formed of at least one of Mg, Ag, Al, Ca and an alloy thereof having low work functions.

The organic light emitting diode 310 may be formed to further include a thin film transistor including a semiconductor layer, a gate electrode, and source and drain electrodes.

Subsequently, referring to FIGS. 3B and 3C, an upper substrate 320 facing the lower substrate 300 is provided. The upper substrate 320 may comprise at least one of a glass, a plastic, and a conductive material. When the upper substrate 320 is formed of glass, the upper substrate 320 may have a more excellent adhesion characteristic to a frit.

A frit 330 is applied along an edge of the upper substrate 320. The frit 330 is formed by melting glass formed of at least one selected from the group consisting of $MgO$, $CaO$, $BaO$, $Li_2O$, $Na_2O$, $K_2O$, $B_2O_3$, $V_2O_5$, $ZnO$, $TeO_2$, $Al_2O_3$, $SiO_2$, $PbO$, $SnO$, $P_2O_5$, $Ru_2O$, $Rh_2O$, $Fe_2O_3$, $CuO$, $TiO_2$, $WO_3$, $Bi_2O_3$, $Sb_2O_3$, lead-borate glass, tin-phosphate glass, vanadate glass and borosilicate glass, grinding the melted glass to form fine glass powder, and mixing the powder with an organic binder, so that a paste is formed. The paste may be applied by a screen-printing or dispensing method.

A filler for controlling a thermal expansion coefficient or an absorber for absorbing laser or infrared ray may be further added to the frit 330. When the filler is included in the frit 330, pores may be easily formed compared to when the filler is not included in the frit. The filler may be at least one of a zirconium-tungsten-phosphate based filler, a zirconium-phosphate based filler (e.g., zirconium phosphate), a zirconium based filler (e.g., zirconium), an eucryptite based filler (e.g., beta-eucryptite), a cordierite based filler, alumina, silica, zinc silicate, and aluminum titanate. The filler may be added to the frit at about 3 wt % to 30 wt %.

Subsequently, the upper substrate 320 to which the frit 330 is applied is injected into a furnace to fire the frit 330. The firing of the frit 330 may be performed at a temperature of about 300° C., to about 500° C., thereby removing moisture or an organic binder from the frit, and hardening the frit. When the material, the firing temperature, and other firing conditions are controlled, pores having a size of about 0.1 μm or less may be formed in the frit 330 after the firing.

Subsequently, referring to FIG. 3D, the upper substrate 320 is disposed over the lower substrate 300 having the organic light emitting diode 310. Heat is applied along the frit 330 formed on the upper substrate 320. The heat source may be laser or infrared ray. When the heat is applied to the frit 330, the frit 330 melts and becomes sticky, thereby attaching the upper substrate to the lower substrate.

When conditions of the heat source applied to the frit 330 are determined to achieve desired frit characteristics, depending on the material of the frit 330, pores may be formed in the frit 330 of a desired size, or may increase in size because of expansion and/or through clustering of the pores formed in the firing process. It is preferable that the pores 331 formed in the frit 330 have a size of about 0.2 μm to about 10 μm, and that the temperature applied to the frit 330 be at about 400° C. to about 700° C.

The frit 330 may have a porosity of about 5% to about 95%. The porosity of the frit 330 may be adjusted by controlling the material of the frit 330, the amount of added filler and/or conditions of the heat source applied to the frit 330.

When the pores 331 are formed with the desired sized in the frit 330 or the formed pores are expanded by applying the heat source to the frit 330, the frit 330 melts, and the frit 330 expands to fill the gap which may exist between the frit 330 and the upper substrate 320 or the lower substrate 300. As a result, adhesion between the upper substrate 320 and the lower substrate 300 is further improved. In addition, since the pores 331 can absorb external impact, mechanical strength of the OLED display device is improved.

When a plurality of pores are formed in a frit to absorb external impact, the mechanical strength of an OLED display device can be improved. In addition, by the expansion of the frit caused by the expansion of the pores, a small gap between the frit and an upper or lower substrate can be filled, so that adhesion between the upper and lower substrates is improved.

Although certain inventive aspects have been described with reference to specific exemplary embodiments, it will be understood by those skilled in the art that a variety of modifications and variations may be made without departing from the spirit or scope of the present invention.

What is claimed is:

1. An organic light emitting diode (OLED) display device, comprising:
    a lower substrate;
    an organic light emitting diode disposed on the lower substrate;
    an upper substrate; and
    a glass frit disposed between the lower substrate and the upper substrate sealing the lower substrate to the upper substrate,
    wherein the glass frit includes a plurality of pores, wherein the upper substrate is sealed to the lower substrate by the glass frit.

2. The OLED display device according to claim 1, wherein the frit has a porosity of between about 5% and about 95%.

3. The OLED display device according to claim 1, wherein the frit has a porosity of between about 5% and about 70%.

4. The OLED display device according to claim 1, wherein the frit comprises a filler and at least one material selected from the group consisting of MgO, CaO, BaO, $Li_2O$, $Na_2O$, $K_2O$, $B_2O_3$, $V_2O_5$, ZnO, $TeO_2$, $Al_2O_3$, $SiO_2$, PbO, SnO, $P_2O_5$, $Ru_2O$, $Rh_2O$, $Fe_2O_3$, CuO, $TiO_2$, $WO_3$, $Bi_2O_3$, $Sb_2O_3$, lead-borate glass, tin-phosphate glass, vanadate glass, and borosilicate glass.

5. The OLED display device according to claim 4, wherein the filler comprises at least one of a zirconium-tungsten-phosphate based filler, a zirconium-phosphate based filler, a zirconium based filler, an eucryptite based filler, a cordierite based filler, alumina, silica, zinc silicate, and aluminum titanate.

6. The OLED display device according to claim 4, wherein the filler is between about 3 wt % and about 30 wt % of the frit.

7. The OLED display device according to claim 4, wherein the frit further includes an absorber for absorbing laser or infrared radiation.

8. The OLED display device according to claim 1, wherein the lower substrate is formed of glass.

9. The OLED display device according to claim 1, wherein the upper substrate is formed of glass.

10. The OLED display device according to claim 1, wherein the pores have a size of between 0.2 μm and about 10 μm.

* * * * *

UNITED STATES PATENT AND TRADEMARK OFFICE
CERTIFICATE OF CORRECTION

| | | |
|---|---|---|
| PATENT NO. | : 8,110,982 B2 | Page 1 of 1 |
| APPLICATION NO. | : 12/378433 | |
| DATED | : February 7, 2012 | |
| INVENTOR(S) | : Oh-June Kwon et al. | |

It is certified that error appears in the above-identified patent and that said Letters Patent is hereby corrected as shown below:

At column 4, line 5, please delete "1.5 m", and insert -- 1.5 m. --, therefor.

Signed and Sealed this
Twenty-sixth Day of June, 2012

David J. Kappos
*Director of the United States Patent and Trademark Office*